United States Patent
Hayashi et al.

(10) Patent No.: US 6,767,392 B2
(45) Date of Patent: Jul. 27, 2004

(54) DISPLACEMENT GOLD PLATING SOLUTION

(75) Inventors: Katsunori Hayashi, Hiratsuka (JP); Yoshimasa Hirose, Hiratsuka (JP)

(73) Assignee: Electroplating Engineers of Japan Limited (JP)

( * ) Notice: Subject to any disclaimer, the term of this patent is extended or adjusted under 35 U.S.C. 154(b) by 0 days.

(21) Appl. No.: 10/156,322

(22) Filed: May 24, 2002

(65) Prior Publication Data

US 2003/0047108 A1 Mar. 13, 2003

(30) Foreign Application Priority Data

Jun. 29, 2001 (JP) ........................................ 2001-197737

(51) Int. Cl.⁷ .......................... C23C 18/31; B05B 1/00; B22F 7/00; B05D 1/18
(52) U.S. Cl. ..................... 106/1.23; 106/1.26; 427/436; 427/438
(58) Field of Search .............................. 106/1.23, 1.26; 427/436, 438

(56) References Cited

U.S. PATENT DOCUMENTS

| | | | | |
|---|---|---|---|---|
| 3,904,493 A | * | 9/1975 | Losi et al. ................. | 205/240 |
| 4,012,294 A | * | 3/1977 | Losi et al. ................. | 205/248 |
| 5,364,460 A | * | 11/1994 | Morimoto et al. ......... | 106/1.23 |
| 5,470,381 A | * | 11/1995 | Kato et al. ................. | 106/1.23 |
| 5,910,340 A | * | 6/1999 | Uchida et al. ............. | 427/437 |
| 6,183,545 B1 | * | 2/2001 | Okuhama et al. .......... | 106/1.18 |
| 6,194,032 B1 | * | 2/2001 | Svedberg et al. .......... | 427/304 |
| 6,338,787 B1 | * | 1/2002 | Obata et al. ................ | 205/687 |
| 6,398,856 B1 | * | 6/2002 | Nakazawa ................. | 106/1.26 |
| 2002/0079226 A1 | * | 6/2002 | Obata et al. ................ | 205/98 |

FOREIGN PATENT DOCUMENTS

| | | |
|---|---|---|
| JP | 05-295558 A | 11/1993 |
| JP | 07-034258 A | 2/1995 |
| JP | 10-317157 A | 12/1998 |

OTHER PUBLICATIONS

English translation of JP07/034258, Feb. 1995.*
English translation of JP10/317157, Dec. 1998.*
"Grant & Hackh's Chemical Dictionary", Grant et al., 5th Edition, p. 561, 1987.*

* cited by examiner

Primary Examiner—Helene Klemanski
(74) Attorney, Agent, or Firm—Roberts & Roberts, LLP

(57) ABSTRACT

The present invention provides a non-cyanide displacement gold plating solution with which even an electroless nickel-boron plated or electrolytic nickel plated substrate can be subjected to displacement gold plating with good adhesion properties and high solderability. The displacement gold plating solution in accordance with the present invention contains 0.01 to 1.0 g/L (expressed in terms of gold concentration) of sodium gold sulfite or ethylene diamine complex of sodium gold sulfite, 10 to 100 g/L of sulfite, 5 to 50 g/L of organic carboxylic acid or salt thereof, and 5 to 50 g/L of ethylene diamine tetraacetic acid or salt thereof, and has a pH value in the weak acid range of 4.5 to 6.

9 Claims, No Drawings

DISPLACEMENT GOLD PLATING SOLUTION

BACKGROUND OF THE INVENTION

1. Technical Field

The present invention relates to a non-cyanide displacement gold plating solution and, more particularly, to a non-cyanide displacement gold plating solution which is suitable when gold plating is performed on an electrolytic nickel plated substrate by displacement.

2. Background Art

In recent years, large-scale integration of semiconductor devices has advanced rapidly, and accordingly the substrate of printed wiring board etc. that mounts the semiconductor devices has come to have a high wiring density. For such a wiring board, for example the parts-mounting portions, terminal portions, etc. of a wiring circuit are plated with gold to improve the solderability and wire bonding ability. In this case, nickel-based plating is generally performed as a substrate for gold plating.

As the nickel-based plating for forming the substrate for gold plating, electrolytic nickel plating, electroless nickel-phosphorus plating, electroless nickel-boron plating, and the like are known. For the gold plating performed on the substrate, electroless plating rather than electrolytic plating is often used because a uniform plating thickness can be obtained despite small gaps, intricate shapes, etc.

As an electroless gold plating solution, a solution using gold cyanide complex has typically been known, and also various kinds of non-cyanide gold plating solutions have been proposed from the viewpoint of the influence of recent environmental issues and the like.

In some of the non-cyanide gold plating solutions, sulfite, mercaptosuccinic acid, ethylene diamine, etc. are used as a complexing agent. The non-cyanide gold plating solution is broadly divided into a displacement gold plating solution for displacement of a substrate metal and a so-called electroless gold plating solution for depositing a gold film by using a reducing agent.

With the conventional displacement gold plating solution, there has been a tendency such that although an electroless nickel-phosphorous plated substrate can be subjected to displacement gold plating, an electroless nickel-boron plated substrate cannot satisfactorily be plated with gold. That is, the conventional displacement gold plating solution cannot satisfy the requirements for practical characteristics such as gold plating adhesion properties and solderability.

In the case where the substrate is electrolytic nickel plated, it is said to be very difficult to cause a displacement reaction of nickel by gold using a conventionally proposed cyanide or non-cyanide displacement gold plating solution because of the influence of nickel oxides. Also, even if displacement gold plating can be performed on the electrolytic nickel plated substrate, the adhesion thereof is very poor, and a practical level of solderability cannot be realized.

DISCLOSURE OF THE INVENTION

The present invention has been made in view of the above situation, and accordingly an object thereof is to provide a non-cyanide displacement gold plating solution with which even an electroless nickel-boron plated or electrolytic nickel plated substrate can be subjected to displacement gold plating with good adhesion properties and high solderability.

To achieve the above object, the inventors conducted studies earnestly on sulfite-based displacement gold plating solution, and resultantly the inventors came up with an idea for a displacement gold solution in accordance with the present invention.

The displacement gold plating solution in accordance with the present invention is characterized by containing 0.01 to 1.0 g/L (expressed in terms of gold concentration) of sodium gold sulfite or ethylene diamine complex of sodium gold sulfite, 10 to 100 g/L of sulfite, 5 to 50 g/L of organic carboxylic acid or salt thereof, and 5 to 50 g/L of ethylene diamine tetraacetic acid or salt thereof, and having a pH value in the weak acid range of 4.5 to 6.0.

The outstanding feature of the displacement gold plating solution in accordance with the present invention is that the gold concentration is as low as 0.01 to 1.0 g/L and the pH value is in the weak acid range of 4.5 to 6.0. According to the displacement gold plating solution in accordance with the present invention, not only an electroless nickel-phosphorous plated substrate but also an electroless nickel-boron plated substrate can be subjected to displacement gold plating with good adhesion properties and high solderability. The displacement gold plating solution in accordance with the present invention enables even an electrolytic nickel plated substrate to be subjected to displacement gold plating that has good adhesion properties and satisfies practical requirements for solderability.

For the displacement gold plating solution in accordance with the present invention, the gold compound in the plating solution is contained in a form of sodium gold sulfite or ethylene diamine complex of sodium gold sulfite, and the gold concentration thereof is 0.01 to 1.0 g/L. If the gold concentration is lower than 0.01 g/L, the amount of gold deposited by displacement is very small, so that the plating time must be impractically prolonged. Also, if the gold concentration is higher than 1.0 g/L, there is a tendency toward poor adhesion.

The displacement gold plating solution in accordance with the present invention contains three kinds of complexing agents of sulfite, organic carboxylic acid or salt thereof, and ethylene diamine tetraacetic acid (hereinafter referred to as EDTA) or salt thereof. In the present invention, sulfite is referred to as a basic first complexing agent, and organic carboxylic acid or salt thereof and EDTA or salt thereof are referred to as a second complexing agent.

For the sulfite, which is the first complexing agent, $SO_3^{2-}$ therein serves to restrain excessive oxidation of nickel and thereby steadily accelerating the displacement of nickel by gold. The sulfite preferably has a concentration in the range of 10 to 100 g/L. If the concentration is lower than 10 g/L, the effect of restraining oxidation is small. If the concentration is higher than 100 g/L, the elution of nickel is excessively restrained, so that the displacement gold plating inversely has poor adhesion.

The organic carboxylic acid or salt thereof, which is the second complexing agent, serves to restrain an increase in pH value due to sulfite and maintains the weak acid range. As the organic carboxylic acid or salt thereof, citric acid, malic acid, lactic acid, and the like can be cited. The organic carboxylic acid or salt thereof preferably has a concentration in the range of 5 to 50 g/L. If the concentration is lower than 5 g/L, the stability of gold sulfite is poor. If the concentration is higher than 50 g/L, the specific gravity of liquid increases, so that the deposition rate decreases.

The EDTA or salt thereof, which is another second complexing agent, serves to stabilize the gold complex in sodium gold sulfite or ethylene diamine complex of sodium gold sulfite. As the salt of EDTA, EDTA-2Na (sodium), EDTA-2K (potassium) can be mainly cited. The EDTA or salt thereof preferably has a concentration in the range of 5 to 50 g/L. If the concentration is lower than 5 g/L, the stability of gold sulfite is poor. If the concentration is higher than 50 g/L, there is a tendency toward poor adhesion.

Furthermore, the displacement gold plating solution in accordance with the present invention preferably has a pH value in the weak acid range of 4.5 to 6.0. If the pH value is lower than 4.5, the stability of gold sulfite is poor. If the pH value is higher than 6.0, there is a tendency toward a decreased deposition rate. Also, the solution temperature is preferably in the range of 45 to 65° C. If the solution temperature is lower than 45° C., the rate of displacement reaction decreases. If the solution temperature is higher than 65° C., there is a tendency toward self-decomposition of the plating solution itself, so that satisfactory displacement gold plating cannot be performed.

The displacement plating solution in accordance with the present invention enables displacement gold plating with good adhesion properties and high solderability in the case where the substrate has been electroless nickel-phosphorous plated or nickel-boron plated. Further, the displacement gold plating solution in accordance with the present invention can be used in the case where the substrate has been electrolytic nickel plated, in which it has so far been difficult to perform the displacement gold plating itself. Specifically, in the case where the surface of a subject to be plated has been electrolytic nickel plated, displacement gold plating with good adhesion properties and high solderability can be performed.

DETAILED DESCRIPTION OF THE PREFERRED EMBODIMENTS

A preferred embodiment of the present invention will be described with reference to Examples and Comparative Example shown below.

EXAMPLES

As displacement gold plating solutions in accordance with the present invention, plating solutions having the composition given in Table 1 were prepared and put into a bath. The symbols given in Table 1 are as shown in Table 2.

TABLE 1

|  | A | B | C | D | pH |
|---|---|---|---|---|---|
| Example 1 | 0.1 | 10 | 5 | 5 | 6.0 |
| Example 2 | 0.5 | 60 | 25 | 30 | 6.0 |
| Example 3 | 1.0 | 100 | 50 | 60 | 6.0 |

TABLE 2

| A | Gold concentration [g/L] |
|---|---|
| B | Sodium sulfite concentration [g/L] |
| C | Citric acid concentration [g/L] |
| D | EDTA-2Na concentration [g/L] |

The displacement gold plating solutions of Examples given in Table 1 were prepared as described below. First, ethylene diamine complex of sodium gold sulfite was prepared in advance by mixing sodium gold sulfite with ethylene diamine. Then, ethylene diamine complex of sodium gold sulfite, citric acid, and EDTA-2Na were put into pure water while being adjusted so that the concentration thereof given in Table 1 was obtained.

Comparative Example

For comparison, a cyanide displacement gold plating solution as described below was prepared. The cyanide displacement gold plating solution contains 2.0 g/L (expressed in terms of gold concentration) of gold potassium cyanide, 30 g/L of potassium citrate, and 30 g/L of EDTA-2Na, and has a pH value of 6.0.

Using the above-described displacement gold plating solutions of examples and comparative example, displacement gold plating was performed on the following three types of plated substrates. As subjects to be plated, a copper plate whose surface was electrolytic nickel plated (substrate 1), a copper plate whose surface was electroless nickel-phosphorous plated (substrate 2), and a copper plate whose surface was electroless nickel-boron plated (substrate 3) were prepared. The above-mentioned electrolytic nickel plating, electroless nickel-phosphorous plating, and electroless nickel-boron plating were performed to form a substrate coat for gold plating, having a thickness of 5 μm, by the publicly known plating solution and plating method.

The displacement gold plating was performed to form a gold plated coat with a thickness of 0.1 μm by dipping the subjects to be plated having the above-mentioned three types of substrates in each of the solutions with a solution temperature of 55° C. for 15 minutes. Subsequently, the adhesion properties and solderability of the gold plated coat were evaluated.

The adhesion was evaluated by the tape test method. Specifically, a cellophane adhesive tape was affixed to the gold plated surface, and when the tape was peeled off, it was visually checked whether or not the gold plated coat was peeled off. Also, the solderability was evaluated by two methods for evaluating the solder wettability and solder bondability. The solder wettability was evaluated by dipping the subject to be plated having been gold plated into a solder bath with a temperature of 230° C. and by observing the state of solder adhering onto the gold plated surface at the time when the subject was pulled up. Also, the solder bondability was evaluated by the peel-off mode of gold plating using a shear tester. The evaluation results of adhesion and solderability are given in Table 3.

TABLE 3

| Substrate | Adhesion | | | Solderability | | | | | |
|---|---|---|---|---|---|---|---|---|---|
| | | | | Solder wettability | | | Peel-off mode | | |
| | 1 | 2 | 3 | 1 | 2 | 3 | 1 | 2 | 3 |
| Example 1 | E | E | E | E | E | E | Solder surface | Solder surface | Solder surface |
| Example 2 | E | E | E | E | E | E | Solder surface | Solder surface | Solder surface |
| Example 3 | F | E | G | F | E | G | Ni surface | Solder surface | Ni surface |
| Comparative Example | P | G | F | P | G | F | Ni surface | Solder surface | Ni surface |

Adhesion: E: Adhering very tightly
G: No peeling of gold plating
F: Peeled off in some portions
P: Peeled off wholly
Solder wettability: E: Excellent
G: Good
F: Solder somewhat repelled
P: Not wetted at all
Peel-off mode: Solder surface = State in which solder remains surely in portion scratched by shear tester
Ni surface = State in which nickel plating of substrate is exposed in portion scratched by shear tester As shown in Table 3, it was confirmed that for the displacement plating solution of Comparative Example, there was no special problem in the case where the substrate was electroless nickel-phosphorous plated, but there was a tendency for both adhesion properties and solderability to be impaired in the case where the substrate was electroless nickel-boron plated, and further the adhesion properties was very poor and the solderability was impractical in the case where the substrate was electrolytic nickel plated. On the other hand, it was found that for the displacement gold plating solutions of Examples, satisfactory displacement gold plating was performed in the case where the substrate was electroless nickel-phosphorous plated or electroless nickel-boron plated, and the adhesion properties was very good and the solderability was sufficiently at a practical level even in the case where the substrate was electrolytic nickel plated.

As described above, according to the displacement gold plating solution in accordance with the present invention, not only in the case where the substrate is electroless nickel-phosphorous plated or electroless nickel-boron plated but also in the case where the substrate is electrolytic nickel plated, in which it has been said to be difficult to perform displacement gold plating, displacement gold plating with excellent adhesion properties and solderability can be performed.

What is claimed is:

1. A process for gold plating an electrolytic nickel plated substrate which comprises:
   i) preparing a displacement gold plating solution which comprises:
      a) sodium gold sulfite or an ethylene diamine complex of sodium gold sulfite;
      b) a first complexing agent, comprising a sulfite;
      c) a second complexing agent, comprising an organic carboxylic acid or salt thereof; and
      d) an additional complexing agent, comprising ethylene diamine tetraacetic acid or a salt thereof;
   ii) providing a electrolytic nickel plated substrate; and
   iii) displacement gold plating the substrate with the displacement gold plating solution.

2. The process of claim 1 wherein the sodium gold sulfite or ethylene diamine complex of sodium gold sulfite is present in the solution at a gold concentration of from about 0.01 g/L to about 1.0 g/L.

3. The process of claim 1 wherein the sulfite is present in the solution at a concentration of form about 10 to about 100 g/L.

4. The process of claim 1 wherein the organic carboxylic acid or salt thereof is present in the solution at a concentration of from about 5 to about 50 g/L.

5. The process of claim 1 wherein the ethylene diamine tetraacetic acid or salt thereof is present in the solution at a concentration of from about 5 to about 50 g/L.

6. The process of claim 1 which has a pH ranging from about 4.5 to about 6.0.

7. The process of claim 1 wherein the sodium gold sulfite or ethylene diamide complex of sodium gold sulfite is present in the solution at a gold concentration of from about 0.01 g/L to about 1.0 g/L; wherein the sulfite is present in the solution at a concentration of form about 10 to about 100 g/L; wherein the organic carboxylic acid or salt thereof is present in the solution at a concentration of from about 5 to about 50 g/L; wherein the ethylene diamine tetraacetic acid or salt thereof is present in the solution at a concentration of from about 5 to about 50 g/L; and wherein the pH of the solution ranges from about 4.5 to about 6.0.

8. The process of claim 1 wherein the organic carboxylic acid is selected from the group consisting of citric acid, malic acid, and lactic acid.

9. The process of claim 1 wherein the ethylene diamine tetraacetic acid salt is selected from the group consisting of sodium and potassium salts of ethylene diamine tetraacetic acid.

* * * * *